US006067655A

United States Patent [19]

Kovacs et al.

[11] Patent Number: 6,067,655

[45] Date of Patent: May 23, 2000

[54] BURST ERROR LIMITING SYMBOL DETECTOR SYSTEM

[75] Inventors: Janos Kovacs, N. Andover, Mass.; Ronald Kroesen, Ft. Collins, Colo.; Jason Byrne, North Andover, Mass.

[73] Assignee: STMicroelectronics, N.V., Netherlands

[21] Appl. No.: 08/919,868

[22] Filed: Aug. 28, 1997

[51] Int. Cl.[7] .................................................... H03M 13/00

[52] U.S. Cl. ............................................ 714/762; 714/788

[58] Field of Search ................................. 371/37.1, 39.1, 371/5.1; 714/762, 761, 787, 788, 752; 345/348; 381/93, 83

[56] References Cited

U.S. PATENT DOCUMENTS

| | | | |
|---|---|---|---|
| 4,449,237 | 5/1984 | Stepp et al. | 381/93 |
| 4,953,183 | 8/1990 | Bergmans et al. | 375/348 |
| 5,361,400 | 11/1994 | Kazecki et al. | 455/63 |
| 5,414,771 | 5/1995 | Okada et al. | 371/5.1 |
| 5,631,909 | 5/1997 | Weng et al. | 371/5.1 |
| 5,657,331 | 8/1997 | Metzner et al. | 371/39.1 |
| 5,668,832 | 9/1997 | Yamamoto | 375/233 |
| 5,691,933 | 11/1997 | Fredrickson | 371/37.1 |
| 5,727,003 | 3/1998 | Zook | 371/39.1 |
| 5,742,642 | 4/1998 | Fertner | 375/233 |

*Primary Examiner*—Albert De Cady
*Assistant Examiner*—Shelly A Chase
*Attorney, Agent, or Firm*—Brian J. Colandreo; Theodore E. Galanthay; Lisa K. Jorgenson

[57] ABSTRACT

A burst error limiting symbol detector system includes a symbol detector circuit responsive to a truncated sample signal for detecting binary symbols encoded in a truncated sample signal with reference to at least one preselected reference level; a feedback equalizer circuit for providing a feedback equalizer signal for cancelling undesired samples in an input signal; a summing circuit, responsive to the input signal and the feedback equalizer signal for providing the truncated sample signal to the symbol detector circuit; and a feedback suppressor circuit responsive to the truncated sample being within a predetermined range of the preselected reference level for suppressing the feedback equalizer signal to prevent marginal detected binary symbols from contributing to the cancellation of undesired samples in the input signal.

7 Claims, 7 Drawing Sheets

100e

BURST ERROR LIMITING SYMBOL DETECTOR SYSTEM

RELATED CASE

This application is a continuation-in-part of a U.S. patent application entitled "Constrained Fixed Delay Tree Search Receiver for a MTR=2 Encoded Communication Channel", Janos Kovacs and Jack Kenney, filed on Jun. 30, 1997.

FIELD OF INVENTION

This invention relates to a burst error limiting symbol detector system.

BACKGROUND OF INVENTION

Sample channel processors are frequently used in signal processing circuits to enable accurate reading of high frequency signals of devices such as communication channels (modems), disk drive read channels, CD ROMs, and recording channels. These systems essentially consist of an encoder/transmitter which receives data input comprising a series of state transitions, and the channel which receives the encoded data input and frequently introduces unwanted distortions and noise. The channel output is delivered to a filter which removes noise and samples the encoded signal, after which a detector determines whether a signal transition has occurred based on the samples taken from the filter, and a decoder provides data output based on the detected signal. For successful data transmission, the data output should be the same as the data input. The effectiveness of the data transmission depends on how accurately the sampled data represents the actual input data signal.

As technological advances enable devices to operate at increased data rates, the transitions occur closer together in time, making it more difficult to filter out channel noise and retain the integrity of the original input data signal based on the data samples taken. A number of prior art methods have been developed to overcome this problem.

One simple approach to overcoming this problem is to use a Decision Feedback Equalizer (DFE). A DFE uses one data sample to determine whether or not a transition has occurred in the input data signal. A DFE circuit essentially consists of a filter, an adder, a detector (usually a comparator) and a feedback equalizer. The filter concentrates the energy of the input signal so that the amplitude of the signal exceeds a predetermined detection threshold, and takes one sample from the incoming signal. The remaining signal information is discarded. The comparator looks at the amplitude of this truncated sample signal and detects whether or not the sample has exceeded the predetermined threshold, indicating that a state transition has occurred. The feedback equalizer responds to the output of the detector, adding a feedback signal to the input of the comparator, thus incorporating signal information from the previous sample into the processing of the current sample. Problems with this technique include loss of important signal information because of the reliance on only one sample and distortion of the input signal.

Yet another problem arises from the recursive or feedback nature of the decision which uses past decisions to generate optimal feedback equalizer output to cancel post-cursor intersymbol interference (ISI). But this optimal decision is made only when all past decisions are correct. If any of them were in error there is a likelihood that the feedback equalizer will generate an output which instead of cancelling post cursor ISI will actually increase or compound the error by feeding back cancellation signals of the wrong polarity. As a result further errors, burst errors, can be generated by the DFE detector. Thus such systems are capable of generating a long sequence of burst errors in response to a single bit error. The duration of this error sequence is characterized by the burst error length measured by the number of bits that may contain faulty decisions. The theoretical probability of the occurrence of any particular burst error length is inversely proportional to the length. There has to be a limit in a practical system so as not to exceed the burst error correction capabilities of presently used error correction methods. For example, in current disc drive channels the probability of a burst error which is longer than 60 bits has to be kept below one in ten thousand. Prior art systems do not meet this target.

SUMMARY OF INVENTION

It is an object of this invention to provide an improved burst error limiting symbol detection system.

It is a further object of this invention to provide such a burst error limiting symbol detection system which reduces the probability of all burst error lengths.

The invention results from the realization that the probability of occurrence of burst error lengths can be reduced by preventing marginal detected binary symbols from entering the feedback loop where they would contribute to the cancellation of undesired samples in the input signal by either feeding back one or more zeroes or another ternary level, or disconnecting the feedback equalizer from the summing circuit input or employing a second symbol detector to feed back decisions based on the original input signal instead of the truncated sample signal.

This invention features a burst error limiting symbol detector system including a symbol detector circuit responsive to a truncated sample signal for detecting binary symbols encoded in a truncated sample signal with reference to at least one preselected reference level and a feedback equalizer circuit for providing a feedback equalizer signal for cancelling undesired samples in an input signal. A summing circuit responsive to the input signal and the feedback equalizer signal provides the truncated sample signal to the symbol detector circuit. A feedback suppressor circuit responsive to the truncated sample being within a predetermined range of the preselected reference level suppresses the feedback equalizer signal to prevent marginal detected binary symbols from contributing to the cancellation of undesired samples in the input signal.

In a preferred embodiment the feedback suppressor circuit may include a marginal decision indicator for detecting the predetermined range and switch means for selectively replacing at least one marginal detecting binary symbol with a ternary level for preventing the marginally detected binary symbol from contributing to the feedback symbol. The feedback suppressor circuit may include a marginal decision indicator for detecting the predetermined range and switch means for selectively disconnecting the feedback signal from the summing circuit. The feedback suppressor circuit may include a marginal decision indicator, a second symbol detector circuit responsive to the input signal and a switching circuit responsive to the marginal decision indicator detecting the predetermined range for disconnecting the symbol detector from and interconnecting the second symbol detector to the feedback equalizer circuit in response to a marginal detected binary symbol.

DISCLOSURE OF PREFERRED EMBODIMENT

Other objects, features and advantages will occur to those skilled in the art from the following description of a preferred embodiment and the accompanying drawings, in which.

Figure 2:
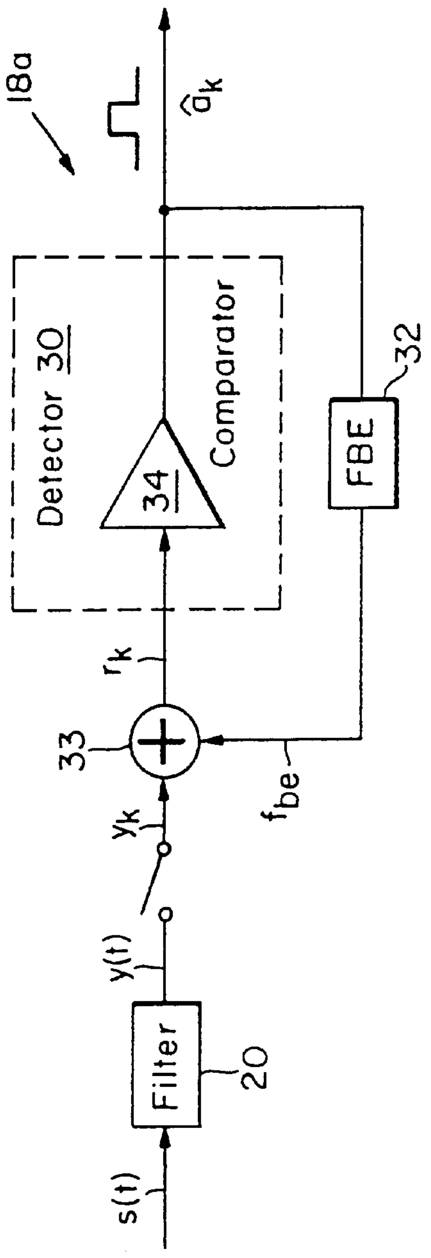
FIG. 2 Prior Art
FIG. 2 is a schematic block diagram of a receiver for the communication channel of FIG. 1 using a conventional Decision Feedback Equalizer (DFE) detector.
Figure 8:
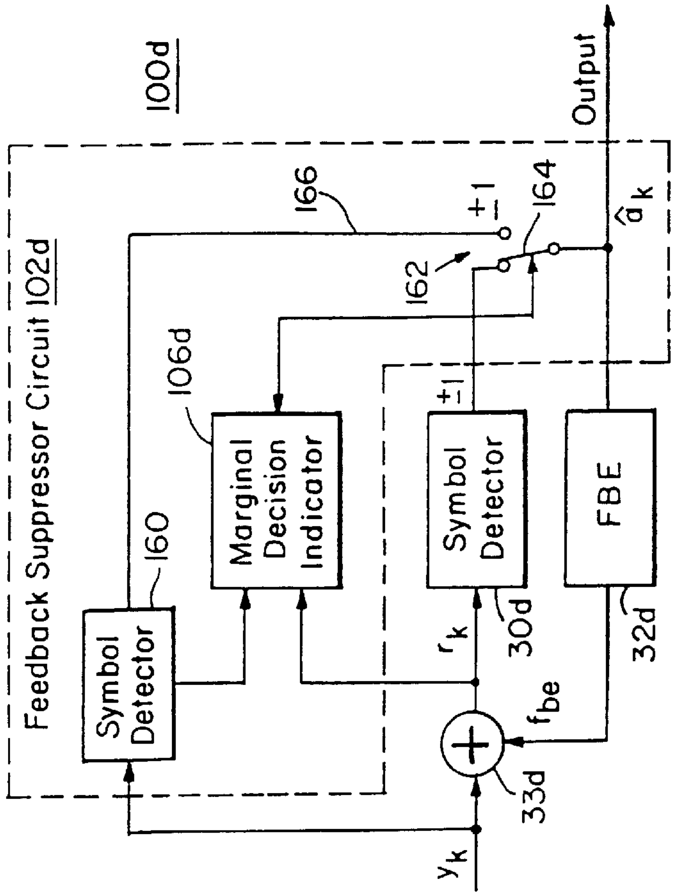
Figure 4:
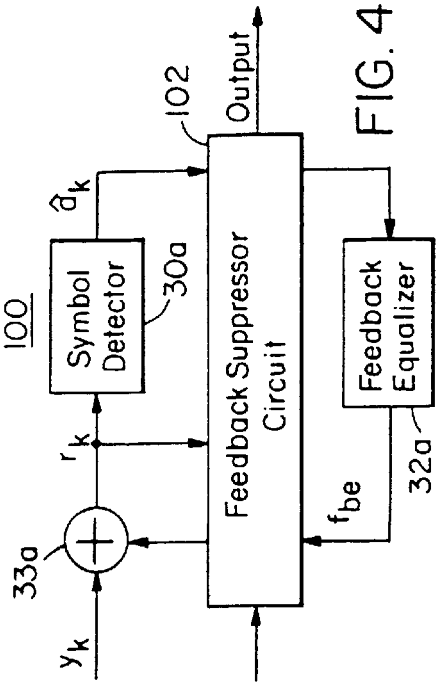
Figure 9:
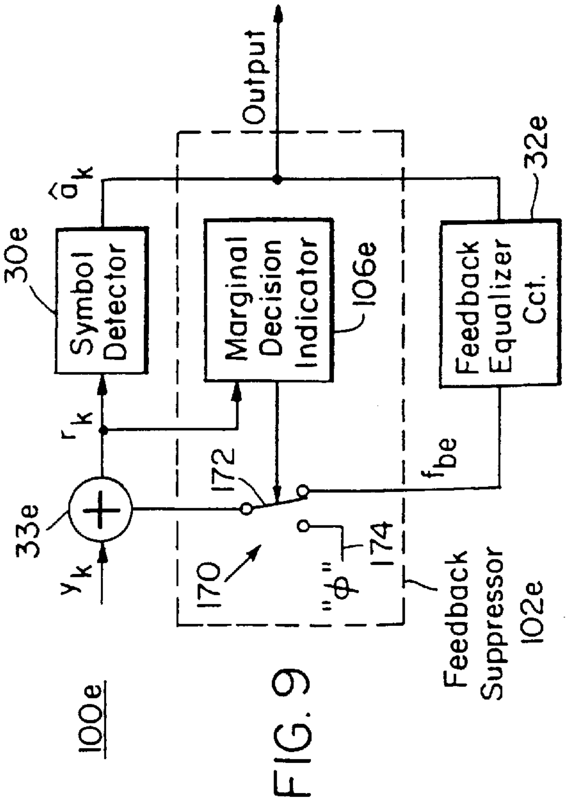
Figure 5:
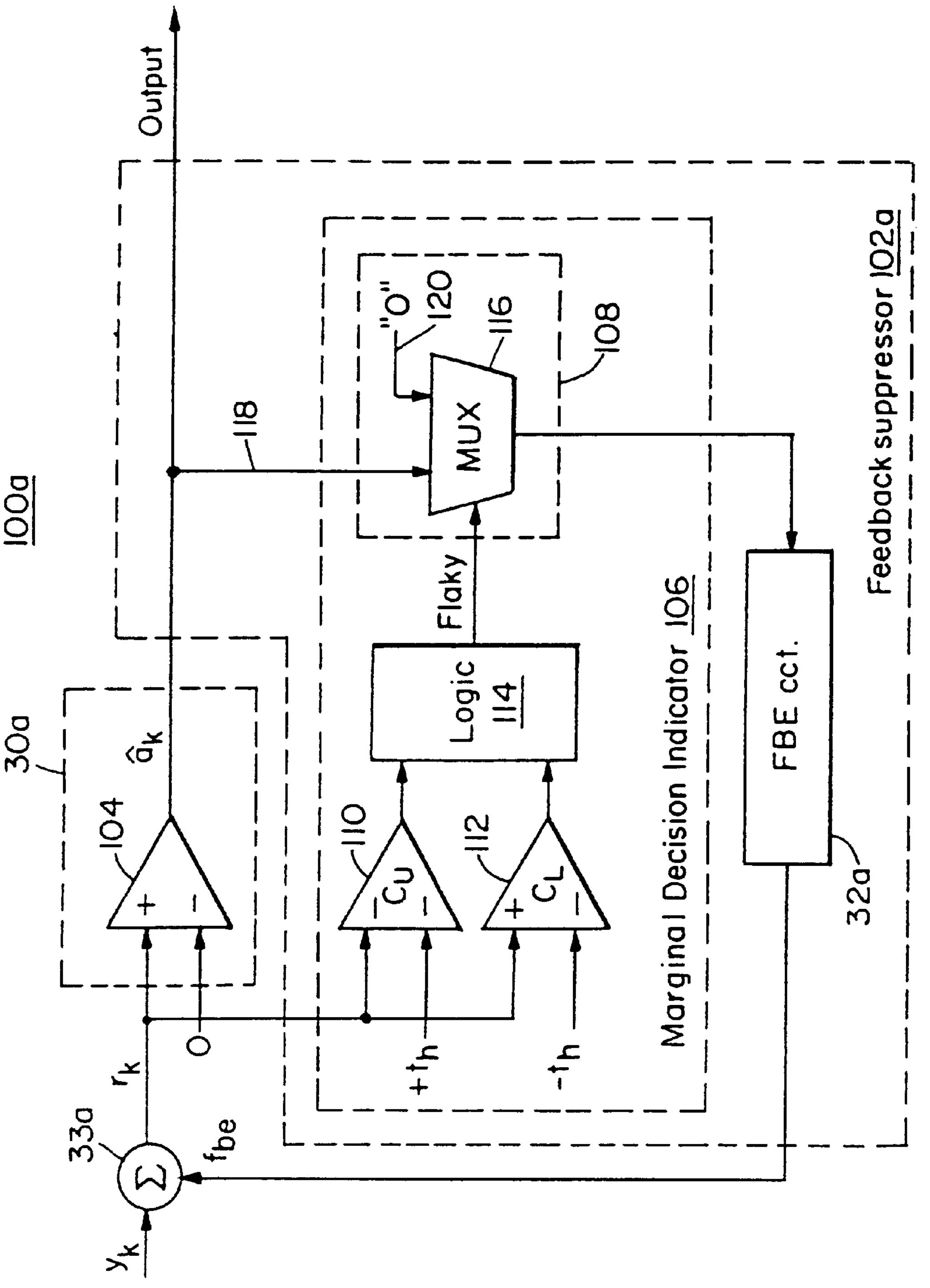
Figure 6:
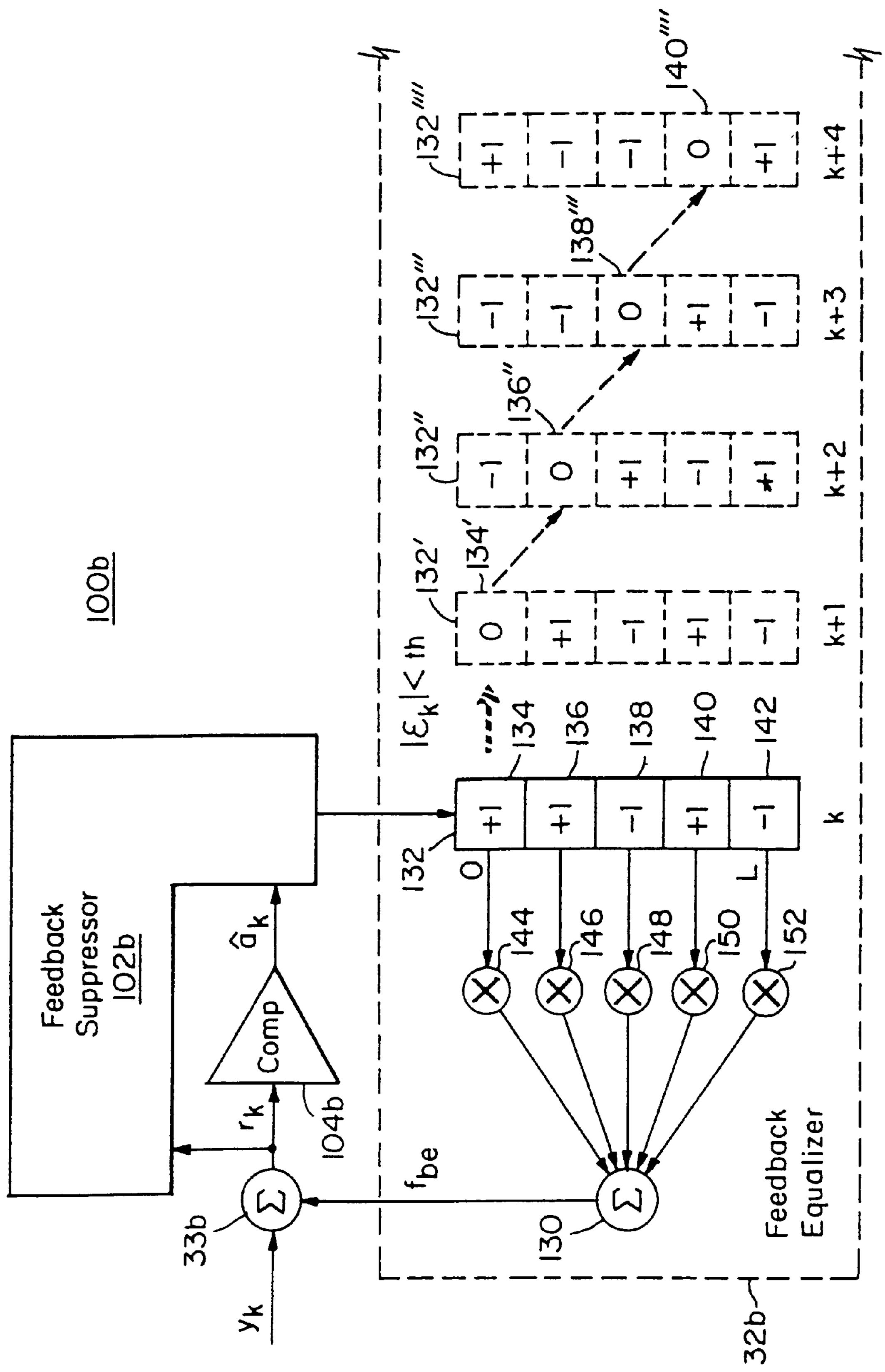
Figure 7:
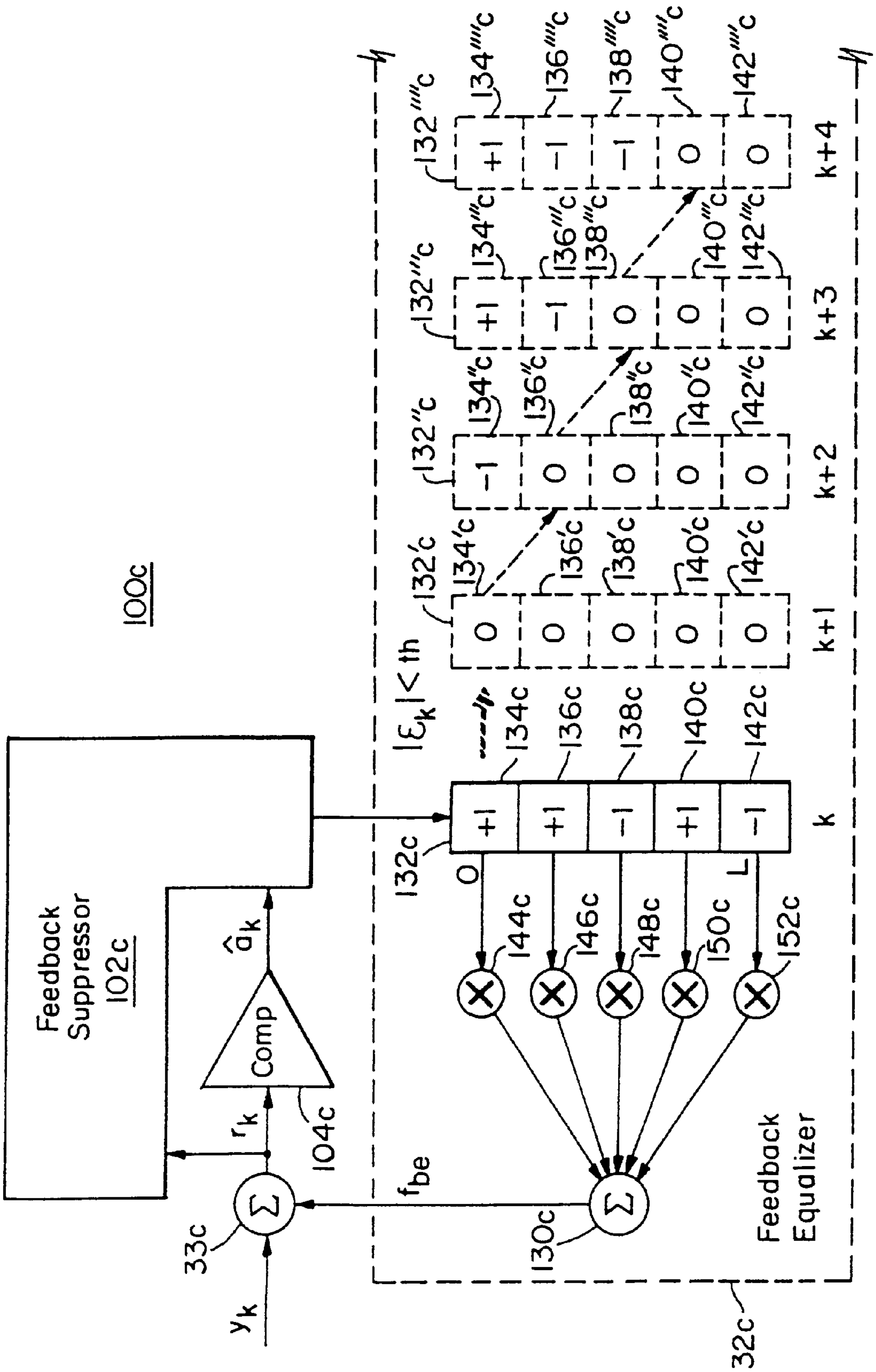
Figure 10:
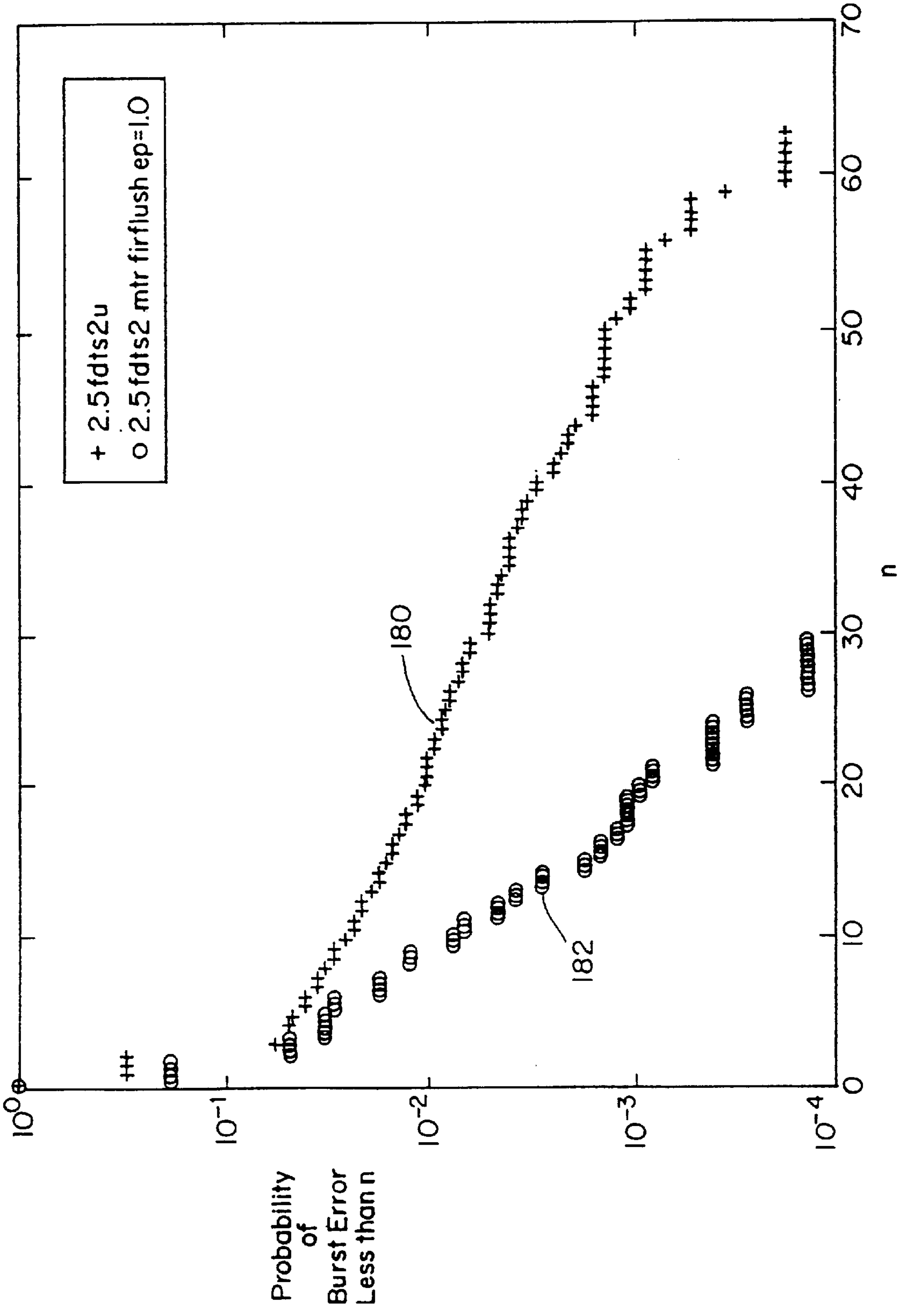

FIGS. 3A–E illustrate a number of waveforms associated with the operation of the DFE of FIG. 2;

FIG. 4 is a simplified block diagram of a burst error limiting symbol detector system according to this invention;

FIG. 5 is block diagram of the system of FIG. 4 showing one embodiment of the feedback suppressor in greater detail;

FIG. 6 is a schematic diagrammatic view of the feedback equalizer circuit of FIG. 5 utilizing a single zero insertion;

FIG. 7 is a view similar to FIG. 6 using a full zero insertion;

FIG. 8 is a view similar to FIG. 5 showing another embodiment of the feedback suppressor of FIG. 4 in greater detail;

FIG. 9 is a view similar to FIG. 5 showing yet another embodiment of the feedback suppressor of FIG. 4 in greater detail; and FIG. 10 is an illustration of the reduction in probability versus burst error length for the system of this invention compared to prior art systems.

The burst error limiting symbol detector system according to this invention reduces burst error length by preventing marginal detected binary symbols from entering the feedback loop where they can contribute to the cancellation of undesired samples in the input signal. This is accomplished by either feeding back one or more zeroes or another ternary level or disconnecting the feedback equalizer from the summing circuit input or employing a second symbol detector to feed back decisions based on the original input signal instead of the truncated sample signal. The burst error symbol detector system is typically employed in the receiver portion of a communications channel.

Figure 1:
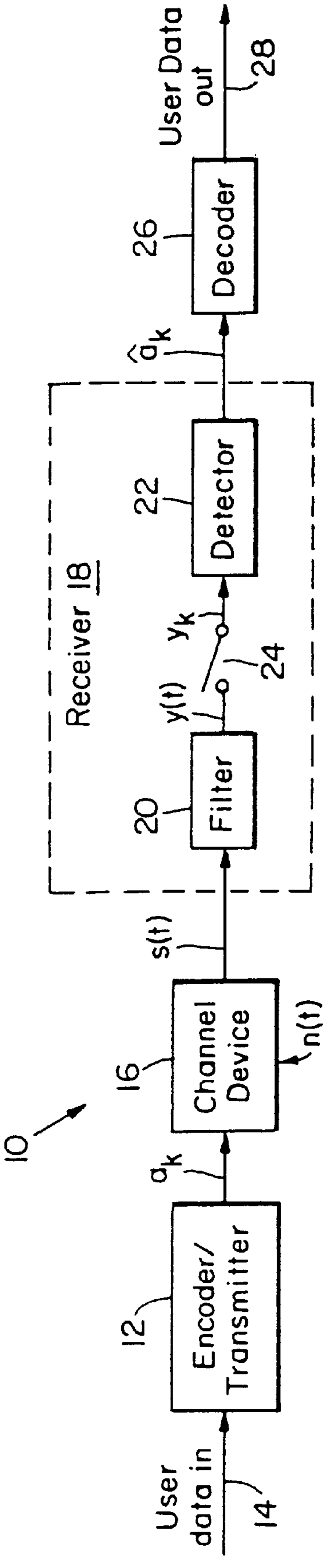
FIG. 1 is a schematic block diagram of a communication channel which may employ a receiver according to this invention.

Such a communications channel is shown in FIG. 1 as including encoder transmitter 12 that receives the user data at its input 14 and provides at its output an encoded signal $a_k$ to the channel device 16 which may be, for example, a communications channel, modem, disk drive read channel, CD ROM or recording channel. At the output of channel device 16 the signal now appears somewhat changed, s(t) and so it is submitted to receiver 18 which includes a receive filter 20 and detector 22. The filtered signal y(t) from receive filter 20 is sampled by a sampling device, shown schematically as switch 24, to provide the sample signal $y_k$ to detector 22. Detector 22 then performs logic operations to provide the restored original signal now designated as $\hat{a}_k$. The output signal $\hat{a}_k$ is delivered to decoder 26 which provides the restored user data at output 28.

Receiver 18*a*, FIG. 2, has been implemented in the past using receive filter 20 and detector 30 with feedback equalizer circuit 32 configured as a decision feedback equalizer DFE. Detector 30 includes comparator 34 whose output develops the restored signal $\hat{a}_k$. $\hat{a}_k$ actually represents the channel symbol which has been identified and restored. Feedback equalizer circuit 32 responds to that restored channel symbol to produce feedback signal $f_{be}$ which is algebraically summed in summer circuit 34 with the output of sample circuit $y_k$ to produce the truncated sample signal $r_k$ to comparator 34.

The operation of the prior art DFE circuit 18*a* can be better understood with respect to the illustrative waveforms in FIGS. 3A–E. The input signal $a_k$ to channel device 16 in FIG. 1 appears as a pulse 40, FIG. 3A. At the output of the channel device 16, FIG. 1, the signal s(t) appears as a periodic wave shape 42 representing the positive-going and negative-going transitions of pulse 40. After filtering by receive filter 20 the signal y(t) appears as shown at 44, FIG. 3B. Upon sampling, y(t) appears as the sample signals $y_k$, including samples 46, 48, 50, 52, 54, 56 and 58 at sample times k, k+1, k+2, k+3, and so on, respectively. Feedback signal $f_{be}$ is a mirror image of $y_k$ samples 46–58. Sample 46' of $f_{be}$, however, is zero, FIG. 3E. Thus, when the two signals $y_k$ and $f_{be}$ are combined in summing circuit 34, the resulting truncated sample signal $r_k$ 60, FIG. 3D, which is shown as a pulse or square wave 62, FIG. 3C, has all of the output samples signals reduced to zero except 46, which is the single sample that is then used in comparator 34 to reconstruct and identify the channel symbol $\hat{a}_k$ at the output of receiver 18*a*. Throughout the specification and the drawings, like parts have been given like numbers and similar parts like numbers accompanied by a prime or one or more lower case letters.

Figures 3A, 3B, 3C, 3D, 3E:
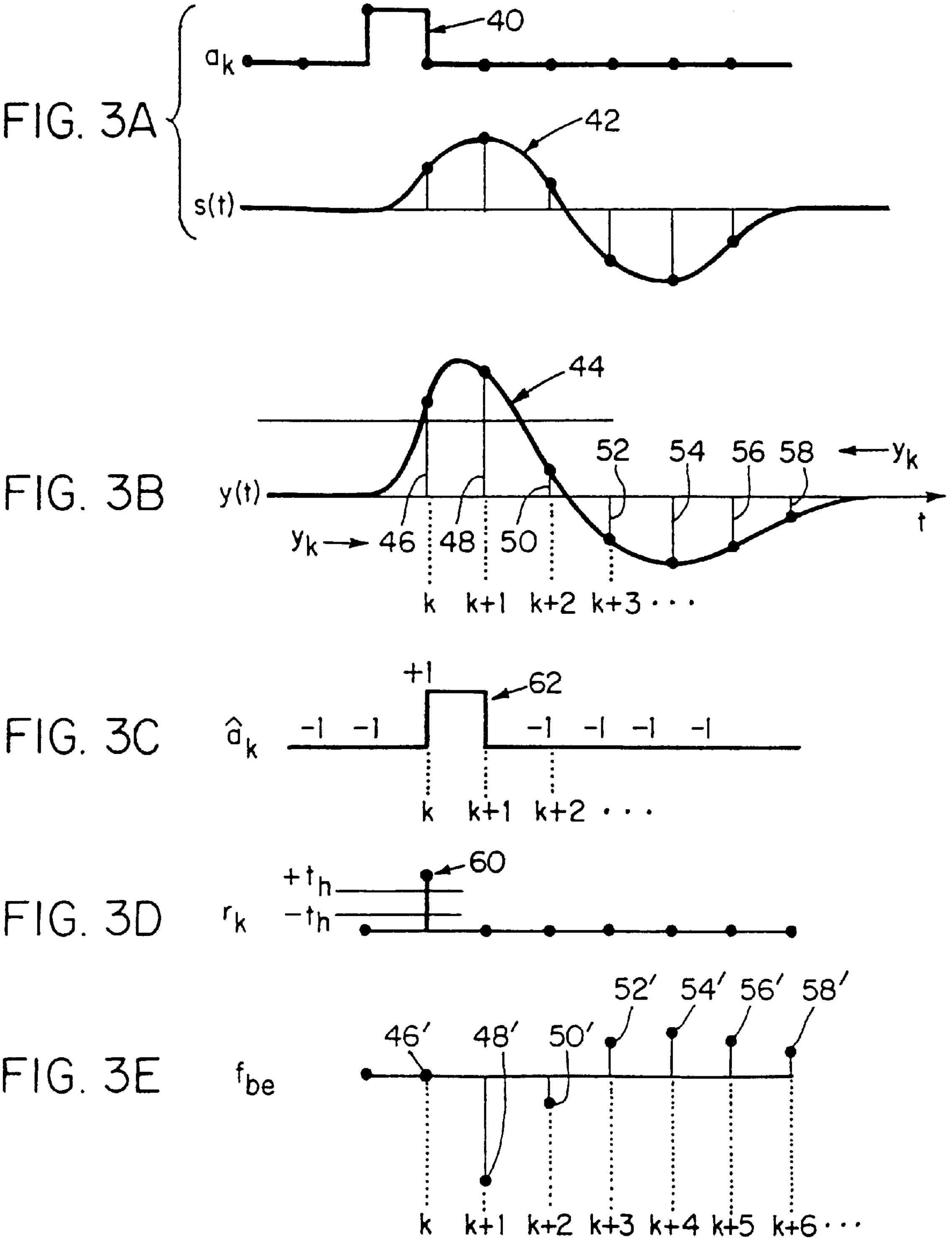

The burst limiting error symbol detector system 100 of FIG. 4 according to this invention includes summer 33*a*, symbol detector 30*a* and feedback equalizer 32*a* and a feedback suppressor circuit 102. The input signal $y_k$ is provided to summer 33*a* which provides the truncated sample signal $r_k$ to symbol detector 30*a*. The detected binary symbol $\hat{a}_k$ is then delivered to feedback suppressor circuit 102; feedback equalizer 32*a* generates the feedback equalizer signal $f_{be}$ which is then supplied through feedback suppressor circuit 102 to summer 33*a*. Typically in prior art operations without the feedback suppressor circuit 102 present, the detected signal $\hat{a}_k$ 62, FIG. 3C, is used to generate the feedback equalizer signal $f_{be}$, FIG. 3E. Sometimes, however, it is noted that when symbol detector 30*a* applies the threshold to determine whether the binary symbol is a+1 or a−1 the level sensed is very close to the threshold. Within a range close to that threshold, the decision is suspect or marginal. That is, while it may be determined by symbol detector 30*a* that a+1 has been detected, it in fact may be a−1; or if symbol detector 30*a* decides that it has detected a−1 it may in fact be a+1. In such a case the polarity of the feedback signal $f_{be}$, FIG. 3E, will be the opposite of that desired to cancel the unwanted portions of the signal and instead double the magnitude of the unwanted signals, making for an error, and this error would be introduced into the feedback loop where it would contribute to future errors.

In order to overcome this problem, the feedback suppressor circuit 102 makes a second determination after symbol detector 30*a* detects the binary symbol $\hat{a}_k$. If the detection level that resulted in the detected binary symbol $\hat{a}_k$ is within a predetermined range of the thresholding level then feedback suppressor circuit decides that this detected binary symbol is marginal and removes it from the feedback loop in one of three ways: Either a ternary level, for example, zero, in the case where the binary signals are +1 or −1, can be inserted into the feedback instead of the actual signal, thereby reducing the feedback contributed by that signal and removing any chance that it could be the cause of an error now or in the future. Or, feedback suppressor circuit 102 could, when it detects that a marginal detected symbol has been identified, refuse to transmit it to feedback equalizer 32*a* and instead feed back a signal directly from the input $y_k$. Or, it can simply disconnect the feedback equalizer signal from summer 33*a* so that no feedback occurs.

The first of those approaches, the insertion of a ternary value, is applied in feedback suppressor, FIG. 5, where symbol detector 30*a* includes a comparator 104 and feedback suppressor 102*a* includes a marginal decision indicator 106 and a switching device 108.

Marginal decision indicator 106 includes a pair of comparators, upper comparator 110 and lower comparator 112 which seek an upper threshold and a lower threshold with respect to the detection threshold. Thus, if a threshold of zero volts is set so that above that level a 30 1 is identified and below that level a−1 is identified, comparators 110 and 112 impose a further range on that threshold so that comparator 110 establishes an upper threshold of +th and comparator 112 establishes a lower threshold of −th. Thus if the detected symbol $a_k$ is within that range it is determined by logic 114 as being marginal. A marginal or flaky signal is then delivered to MUX 116 and switching circuit 108. MUX 116 then refuses the normal +1 or −1 signal on line 118 of comparator 104 and instead inserts a zero present on line 120 or some other ternary level. In this case where a normal binary input is +1 or −1 the ternary level on line 120 is zero. This zero is delivered to feedback equalizer circuit 32*a* instead of the regular $\hat{a}_k$ signal so that the marginal signal on line 118 cannot possibly introduce any errors to this or future detections.

The implementation of feedback equalizer circuit 32*b*, FIG. 6, that demonstrates the insertion and propagation of this ternary value or zero includes summer 130 and shift register 132 including five stages 134, 136, 138, 140 and 142, each of which at time K contains a value of +1 or −1 as shown. The values at each of the stages 134–142 are weighted by multipliers 144, 146, 148, 150, 152, respectively, and delivered to summer 130 where they create the feedback equalizer signal $f_{be}$ to be delivered to summer 33*b*. When a marginal detected binary symbol occurs a zero is inserted in the first stage 134' as shown in the phantom register 132' at time k+1. At times k+2, k+3 and k+4, the zero moves on through subsequent stages until it eventually is moved out. The zero, having replaced a marginal problematic detected symbol, avoids the possibility that that marginal symbol may cause burst errors in the system.

In another implementation of the embodiment of FIG. 5, feedback equalizer 32*c*, FIG. 7, may be provided with a string of zeroes through MUX 116 so that all of the stages 134*c*–142*c* have their contents replaced by zeroes in register 132'*c* at time k+1. These zeroes are then stepped out gradually at times k+2, k+3, k+4, . . . as new data is introduced.

In another embodiment, feedback suppressor circuit 102*d* includes a marginal decision indicator 106*d*, a second symbol detector 160 and switching device 162. Normally, input signal $y_k$ is delivered to summer 33*d* which combines it with feedback equalizer signal $f_{be}$ to provide the truncated sample signal $r_k$ to symbol detector 30*d* whose output $\hat{a}_k$ will be either a+1 or −1. This signal is fed back through swinger 164 of switch 162 to feedback equalizer 32*d* which in turn provides feedback equalizer signal $f_{be}$. However, when marginal decision indicator 106*d* determines that the symbol detected had a level within a predetermined range which makes it only marginally dependable, it provides a signal which disconnects switch 164 from the output of symbol detector 30*d* and instead connects it to the output 166 of second symbol detector 160. Symbol detector 160 is not connected to the truncated sample $r_k$ at the output of summer 33*d*: it is instead connected to the raw input signal $y_k$. It is this signal, being a+1 or a−1, which is now fed back to feedback equalizer circuit 32*d*. In this way the marginal signal which has been detected by symbol detector 30*d* is ignored so that it cannot enter the feedback loop and possibly contribute to further errors.

In yet another embodiment, feedback suppressor 102*e*, FIG. 9, includes marginal decision indicator 106*e* and switching device 170 whose switch 172 is normally connected to the output of feedback equalizer circuit 32*e*, providing the feedback equalizer circuit $f_{be}$ to summer 33*e*. However, when marginal decision indicator 106*e* determines that the truncated sample signal $r_k$ has a level within a predetermined range it decides that the reliability of the detected symbol $\hat{a}_k$ is questionable and drives switch 172 to the other position where it receives zero input on line 174. This zero is now delivered to summer 133*e* instead of the feedback equalizer signal $f_{be}$, thereby cutting off the participation of the $\hat{a}_k$ signal in the feedback loop and preventing it from affecting any errors now or in the future.

The real contribution of this invention can be seen with respect to the plot of probability of burst error length versus the number of burst errors in FIG. 10. There it can be seen that while the prior art characteristic 180 reaches a probability of 1 in 10,000 ($10^{-4}$) only at a burst error length of 60, the system of this invention depicted at 182 provides such a low 1 in 10,000 probability at burst error lengths of only 30 bits long, a significant reduction in the probability for the occurrence of burst errors.

Although specific features of this invention are shown in some drawings and not others, this is for convenience only as each feature may be combined with any or all of the other features in accordance with the invention.

Other embodiments will occur to those skilled in the art and are within the following claims:

What is claimed is:

1. A burst error limiting symbol detector system comprising:

- a symbol detector circuit responsive to a truncated sample signal for detecting binary symbols encoded in said truncated sample signal with reference to at least one preselected reference level;
- a feedback equalizer circuit for providing a feedback equalizer signal for cancelling undesired samples in an input signal;
- a summing circuit, responsive to said input signal and said feedback equalizer signal for providing said truncated sample signal to said symbol detector circuit; and
- a feedback suppressor circuit responsive to said truncated sample being within a predetermined range of said preselected reference level for suppressing said feedback equalizer signal to prevent marginal detected binary symbols from contributing to the cancellation of undesired samples in said input signal.

2. The burst error limiting symbol detector system of claim 1 in which said feedback suppressor circuit includes a marginal decision indicator for detecting said predetermined range and switch means for selectively replacing at least one marginal detected binary symbol with a ternary level for preventing said marginal detected binary symbol from contributing to said feedback signal.

3. The burst error limiting symbol detector system of claim 1 in which said feedback suppressor circuit includes a marginal decision indicator for detecting said predetermined range and switch means for selectively disconnecting said feedback signal from said summing circuit.

4. The burst error limiting symbol detector system of claim 1 in which said feedback suppressor circuit includes a marginal decision indicator, a second symbol detector circuit responsive to said input signal and a switching circuit responsive to said marginal decision indicator detecting said predetermined range for disconnecting said symbol detector from and interconnecting said second symbol detector to said feedback equalizer circuit in response to a marginal detected binary symbol.

5. A burst error limiting symbol detector system comprising:

a symbol detector circuit responsive to a truncated sample signal for detecting binary symbols encoded in said truncated sample signal with reference to at least one preselected reference level;

a feedback equalizer circuit for providing a feedback equalizer signal for canceling undesired samples in an input signal;

a summing circuit, responsive to said input signal and said feedback equalizer signal for providing said truncated sample signal to said symbol detector circuit; and a feedback suppressor circuit responsive to said truncated sample being within a predetermined range of said preselected reference level for suppressing said feedback equalizer signal to prevent marginal detected binary symbols from contributing to the cancellation of undesired samples in said input signal, said feedback suppressor circuit including a marginal decision indicator for detecting said predetermined range and switch means for selectively replacing at least one marginal detected binary symbol with a ternary level for preventing said marginal detected binary symbol from contributing to said feedback signal.

6. A burst error limiting symbol detector system comprising:

a symbol detector circuit responsive to a truncated sample signal for detecting binary symbols encoded in said truncated sample signal with reference to at least one preselected reference level;

a feedback equalizer circuit for providing a feedback equalizer signal for canceling undesired samples in an input signal;

a summing circuit, responsive to said input signal and said feedback equalizer signal for providing said truncated sample signal to said symbol detector circuit; and a feedback suppressor circuit responsive to said truncated sample being within a predetermined range of said preselected reference level for suppressing said feedback equalizer signal to prevent marginal detected binary symbols from contributing to the cancellation of undesired samples in said input signal, said feedback suppressor circuit including a marginal decision indicator for detecting said predetermined range and switch means for selectively disconnecting said feedback signal from said summing circuit.

7. A burst error limiting symbol detector system comprising:

a symbol detector circuit responsive to a truncated sample signal for detecting binary symbols encoded in said truncated sample signal with reference to at least one preselected reference level;

a feedback equalizer circuit for providing a feedback equalizer signal for canceling undesired samples in an input signal;

a summing circuit, responsive to said input signal and said feedback equalizer signal for providing said truncated sample signal to said symbol detector circuit; and a feedback suppressor circuit responsive to said truncated sample being within a predetermined range of said preselected reference level for suppressing said feedback equalizer signal to prevent marginal detected binary symbols from contributing to the cancellation of undesired samples in said input signal, said feedback suppressor circuit including a marginal decision indicator, a second symbol detector circuit responsive to said input signal and a switching circuit responsive to said marginal decision indicator detecting said predetermined range for disconnecting said symbol detector from and interconnecting said second symbol detector to said feedback equalizer circuit in response to a marginal detected binary symbol.

* * * * *